United States Patent
Song et al.

(10) Patent No.: US 9,924,616 B2
(45) Date of Patent: Mar. 20, 2018

(54) SHIELD CAN, ELECTRONIC DEVICE, AND MANUFACTURING METHOD THEREOF

(71) Applicant: Samsung Electronics Co., Ltd., Suwon-si, Gyeonggi-do (KR)

(72) Inventors: Kyunghoon Song, Yongin-si (KR); Jungje Bang, Gumi-si (KR); Kwangsub Lee, Yongin-si (KR); Saebom Lee, Suwon-si (KR); Seyoung Jang, Seongnam-si (KR); Younoh Chi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 14/640,520

(22) Filed: Mar. 6, 2015

(65) Prior Publication Data
US 2015/0264842 A1 Sep. 17, 2015

(30) Foreign Application Priority Data

Mar. 17, 2014 (KR) ........................ 10-2014-0031263

(51) Int. Cl.
| | |
|---|---|
| *H05K 9/00* | (2006.01) |
| *H05K 7/20* | (2006.01) |
| *H01L 23/42* | (2006.01) |
| *H01L 23/552* | (2006.01) |

(52) U.S. Cl.
CPC ......... *H05K 7/20445* (2013.01); *H01L 23/42* (2013.01); *H01L 23/552* (2013.01); *H05K 9/0032* (2013.01); *H01L 2224/16225* (2013.01); *H01L 2224/73253* (2013.01); *H01L 2924/12044* (2013.01); *Y10T 29/4913* (2015.01); *Y10T 29/49144* (2015.01)

(58) Field of Classification Search
CPC .. H05K 9/0032; H05K 7/20445; H01L 23/42; H01L 23/552
See application file for complete search history.

(56) References Cited

U.S. PATENT DOCUMENTS

| | | | |
|---|---|---|---|
| 6,194,653 B1 | 2/2001 | McMiller et al. | |
| 7,623,360 B2 * | 11/2009 | English ................ | H05K 9/0032 361/800 |
| 2007/0012696 A1 | 1/2007 | Levie | |
| 2010/0157544 A1 | 6/2010 | Tsao et al. | |
| 2012/0031661 A1 | 2/2012 | Tan et al. | |
| 2012/0224341 A1 | 9/2012 | Hsieh et al. | |
| 2013/0153286 A1 | 6/2013 | Kim et al. | |

FOREIGN PATENT DOCUMENTS

| | | |
|---|---|---|
| JP | 2013-055090 A | 3/2013 |
| KR | 10-2013-0068901 A | 6/2013 |
| WO | 2007/103741 A2 | 9/2007 |

* cited by examiner

*Primary Examiner* — Robert J Hoffberg
*Assistant Examiner* — Hung Dang
(74) *Attorney, Agent, or Firm* — Jefferson IP Law, LLP

(57) ABSTRACT

A shield can for electromagnetic shielding is provided. The shield can includes a shield cover having a bump protruding laterally therefrom, and a shield frame having a connecting part for selectively fixing the bump at a first height or a second height such that the shield frame is fastened to the shield cover. An electronic device includes a substrate, an internal device mounted on the substrate, and the shield can. The shield cover is located over the internal device, and the shield frame is formed vertically on the substrate to surround the internal device.

14 Claims, 9 Drawing Sheets

SHIELD CAN, ELECTRONIC DEVICE, AND MANUFACTURING METHOD THEREOF

CROSS-REFERENCE TO RELATED APPLICATION(S)

This application claims the benefit under 35 U.S.C. § 119(a) of a Korean patent application filed on Mar. 17, 2014 in the Korean Intellectual Property Office and assigned serial number 10-2014-0031263, the entire disclosure of which is hereby incorporated by reference.

TECHNICAL FIELD

The present disclosure relates to a shield can. More particularly, the present disclosure relates to an electronic device having a shield can, and a method for manufacturing the electronic device.

BACKGROUND

The recent trend of electronic devices, including mobile devices, is to be made smaller and lighter. To meet this trend, electronic components must support high integration and high performance.

An electromagnetic wave is one of several causes that directly affect the performance of an electronic component. Classically, electromagnetic radiation (EMR) is composed of electromagnetic waves, which are synchronized oscillations of electric and magnetic fields that propagate at the speed of light. In modern technologies, EMR is regarded as electromagnetic noise that is emitted from or produces an effect on electronic components. Therefore, various materials, structures and methods have been studied to provide electromagnetic shielding.

In a case where a target electronic component is covered with a suitable material for electromagnetic shielding, heat dissipation from the target component may be often deteriorated. Unfortunately, poor dissipation of heat may reduce the performance of the component or shorten its lifespan.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a shield can suitable for heat dissipation as well as reliable electromagnetic shielding and to also provide an electronic device manufactured to have the shield can.

In accordance with an aspect of the present disclosure, a shield can for electromagnetic shielding is provided. The shield can includes a shield cover having a bump protruding laterally therefrom, and a shield frame having a connecting part for selectively fixing the bump at a first height or a second height such that the shield frame is fastened to the shield cover.

In accordance with another aspect of the present disclosure, an electronic device is provided. The electronic device includes a substrate, an internal device mounted on the substrate, and a shield can including a shield cover located over the internal device and having a bump protruding laterally therefrom, and a shield frame formed vertically on the substrate to surround the internal device and having a connecting part for selectively fixing the bump at a first height or a second height to be fastened to the shield cover.

In accordance with another aspect of the present disclosure, a method for manufacturing an electronic device is provided. The method includes fixing a bump of a shield cover to a first hole formed at a first height of a shield frame to connect the shield cover with the shield frame, soldering an internal device and the shield frame on a substrate such that the shield frame surrounds the internal device, and applying a pressure to the shield cover such that the bump is fixed to a second hole formed at a second height of the shield frame.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
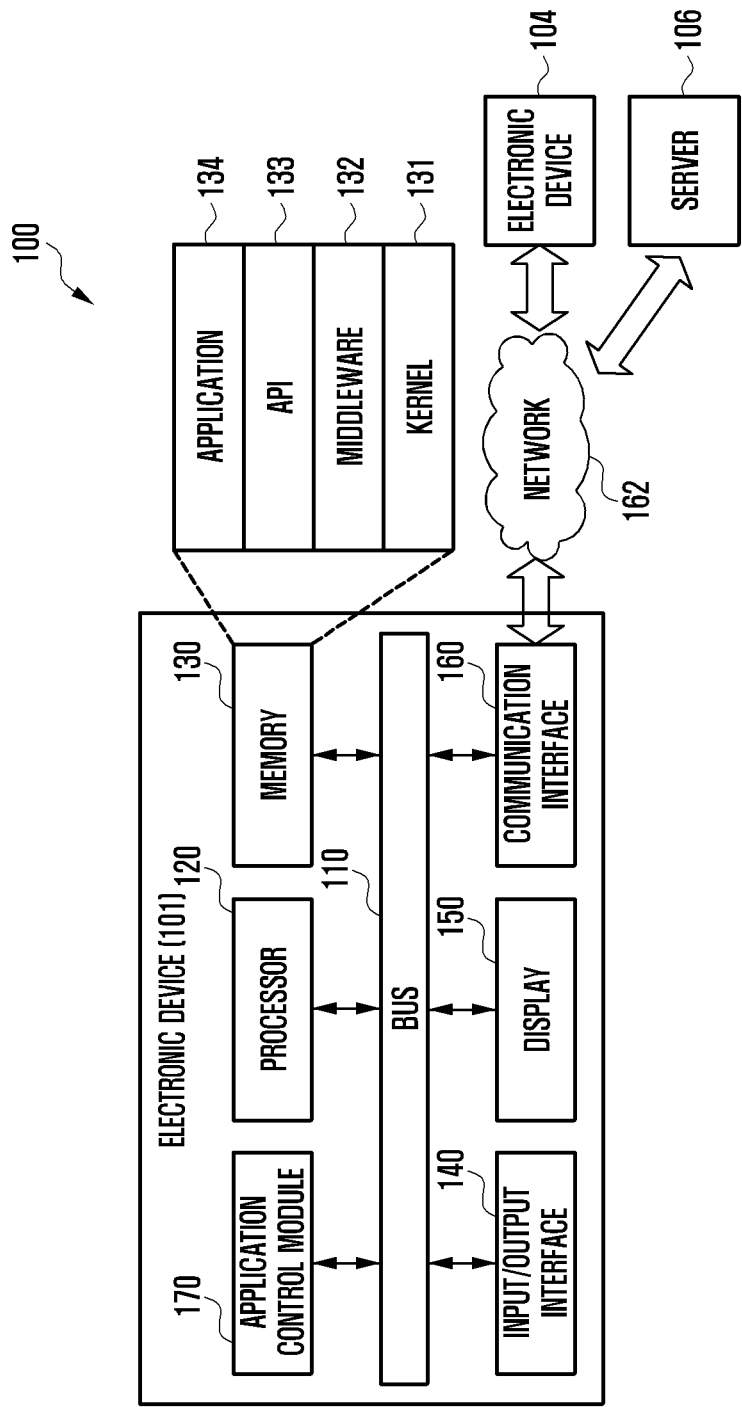
FIG. 1 illustrates a network environment including an electronic device in accordance with various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used in the present disclosure, the expressions "include" or "may include" refer to the existence of a corresponding function, operation, or constituent element, and do not limit one or more additional functions, operations, or constituent elements. Further, as used in the present disclosure, terms such as "include" or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

As used in the present disclosure, the expression "or" includes any or all combinations of words enumerated together. For example, the expression "A or B" may include A, may include B, or may include both A and B.

While expressions including ordinal numbers, such as "first" and "second", as used in the present disclosure may modify various constituent elements, such constituent elements are not limited by the above expressions. For example, the above expressions do not limit the sequence and/or importance of the corresponding constituent elements. The above expressions may be used merely for the purpose of distinguishing a constituent element from other constituent elements. For example, a first user device and a second user device indicate different user devices although both are user devices. For example, a first constituent element may be termed a second constituent element, and likewise a second constituent element may also be termed a first constituent element without departing from the scope of the present disclosure.

When a component is referred to as being "connected" or "accessed" to any other component, it should be understood that the component may be directly connected or accessed to the other component, but another new component may also be interposed between them. Contrarily, when a component is referred to as being "directly connected" or "directly accessed" to any other component, it should be understood that there is no new component between the component and the other component.

The terms as used in various embodiments of the present disclosure are merely for the purpose of describing particular embodiments and are not intended to limit the present disclosure.

Unless defined otherwise, all terms used herein, including technical terms and scientific terms, have the same meaning as commonly understood by a person of ordinary skill in the art to which the present disclosure pertains. Such terms as those defined in a generally used dictionary are to be interpreted to have the meanings equal to the contextual meanings in the relevant field of art, and are not to be interpreted to have ideal or excessively formal meanings unless clearly defined in the present disclosure.

An electronic device according to the present disclosure may be a device including a communication function. For example, the electronic device may include at least one of a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an MP3 player, a mobile medical appliance, a camera, and a wearable device (e.g., a head-mounted-device (HMD) such as electronic glasses, electronic clothes, an electronic bracelet, an electronic necklace, an electronic appcessory, electronic tattoos, or a smartwatch).

According to various embodiments, the electronic device may be a smart home appliance with a communication function. The smart home appliance as the electronic device, for example, may include at least one of a television (TV), a digital video disk (DVD) player, an audio, a refrigerator, an air conditioner, a vacuum cleaner, an oven, a microwave oven, a washing machine, an air cleaner, a set-top box, a TV box (e.g., Samsung HomeSync™, Apple TV™, or Google TV™), a game console, an electronic dictionary, an electronic key, a camcorder, and an electronic photo frame.

According to various embodiments, the electronic devices may include at least one of various medical devices (e.g., magnetic resonance angiography (MRA), magnetic resonance imaging (MRI), computed tomography (CT), and ultrasonic machines), navigation equipment, a global positioning system (GPS) receiver, an event data recorder (EDR), a flight data recorder (FDR), an automotive infotainment device, electronic equipment for ships (e.g., ship navigation equipment and a gyrocompass), avionics, security equipment, a vehicle head unit, an industrial or home robot, an automatic teller machine (ATM) of a banking system, and a point of sales (POS) in a shop.

According to various embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to the present disclosure may be a combination of one or more of the aforementioned various devices. Further, the electronic device according to the present disclosure may be a flexible device. Further, it will be apparent to those skilled in the art that the electronic device according to the present disclosure is not limited to the aforementioned devices.

Hereinafter, an electronic device according to various embodiments of the present disclosure will be discussed with reference to the accompanying drawings. The term "a user" as used in various embodiments may refer to any person who uses an electronic device or any other device (e.g., an artificial intelligence electronic device) using an electronic device.

FIG. 1 illustrates a network environment including an electronic device in accordance with various embodiments of the present disclosure.

Referring to FIG. 1, the network environment 100 includes the electronic device 101, which may include a bus 110, a processor 120, a memory 130, an input/output interface 140, a display 150, a communication interface 160, and an application control module 170.

The bus 110 may be a circuit interconnecting the aforementioned components and transmitting communication (e.g., a control message) between the aforementioned components.

The processor 120, for example, may receive instructions from the aforementioned components (e.g., the memory 130, the input/output interface 140, the display 150, the communication interface 160, and the application control module 170) other than the processor 120 through the bus 110, decode the received instructions, and perform operations or data processing according to the decoded instructions.

The memory 130 may store instructions or data received from or generated by the processor 120 or other components (e.g., the input/output interface 140, the display 150, the communication interface 160, and the application control module 170). The memory 130 may include programming modules, for example, a kernel 131, middleware 132, an application programming interface (API) 133, and applications 134. Each of the programming modules as described above may be formed by software, firmware, hardware, or a combination of two or more thereof.

The kernel 131 may control or manage system resources (e.g., the bus 110, the processor 120, and the memory 130) used to execute operations or functions implemented in the remaining other programming modules, for example, the middleware 132, the API 133, and the applications 134. Further, the kernel 131 may provide an interface that allows the middleware 132, the API 133, or the applications 134 to access and control or manage individual components of the electronic device 101.

The middleware 132 may serve to mediate between the API 133 or the applications 134 and the kernel 131, that is, allow the API 133 or the application 134 to communicate and exchange data with the kernel 131. Further, the middleware 132 may perform control (e.g., scheduling or load balancing) for task requests received from the applications 134 by using, for example, a method of assigning a priority for use of a system resource (e.g., the bus 110, the processor 120, or the memory 130) of the electronic device 101 to at least one of the applications 134.

The API 133 is an interface for allowing the applications 134 to control functions provided by the kernel 131 and the middleware 132, and may include at least one interface or function (e.g., instruction) for, for example, file control, window control, image processing, or text control.

According to various embodiments of the present disclosure, the applications 134 may include a Short Message Service (SMS)/Multimedia Messaging Service (MMS) application, an e-mail application, a calendar application, an alarm application, a health care application (e.g., an application for measuring the amount of exercise or blood glucose), and an environmental information application (e.g., an application for providing atmospheric pressure information, humidity information, temperature information, and the like). Additionally or alternatively, the applications 134 may include an application associated with information exchange between the electronic device 101 and an external electronic device (e.g., an electronic device 104). The application associated with information exchange, for example, may include a notification relay application for transferring specific information to the external electronic device or a device management application for managing the external electronic device.

For example, the notification relay application may include a function of transferring notification information, generated in another application of the electronic device 101 (e.g., the SMS/MMS application, the e-mail application, the health care application, or the environmental information application), to an external electronic device (e.g., the electronic device 104). Additionally or alternatively, the notification relay application, for example, may receive notification information from an external electronic device (e.g., the electronic device 104) and provide the received notification information to a user. The device management application, for example, may manage (e.g., install, remove, or update) a function for at least a part of an external electronic device (e.g., the electronic device 104) communicating with the electronic device 101 (e.g., a function of turning on/off an external electronic device itself (or some components thereof) or adjusting the brightness (or resolution) of a display), an application running on the external electronic device, or a service provided in the external electronic device (e.g., a calling or messaging service).

According to various embodiments of the present disclosure, the applications 134 may include an application specified according to the attribute (e.g., type) of an external electronic device (e.g., the electronic device 104). For example, when the external electronic device is a media player (e.g., an MP3 player), the applications 134 may include an application associated with music playback. Similarly, when the external electronic device is a mobile medical device, the applications 134 may include an application associated with health care. According to an embodiment, the applications 134 may include at least one of an application assigned to the electronic device 101 and an application received from an external electronic device (e.g., a server 106 or the electronic device 104).

The input/output interface 140, for example, may transfer instructions or data, input from a user through an input/output device (e.g., a sensor, a keyboard, or a touch screen), to the processor 120, the memory 130, the communication interface 160, or the application control module 170 through the bus 110. For example, the input/output interface 140 may provide the processor 120 with data corresponding to a user's touch input through a touch screen. Further, the input/output interface 140 may, for example, receive instructions or data from the processor 120, the memory 130, the communication interface 160, or the application control module 170 through the bus 110 and output the received instructions or data through the input/output device (e.g., a speaker or a display). For example, the input/output interface 140 may output voice data processed by the processor 120 to a user through a speaker.

The display 150 may display various pieces of information (e.g., multimedia data or text data) to a user.

The communication interface 160 may establish communication between the electronic device 101 and an external electronic device (e.g., the electronic device 104 or the server 106). For example, the communication interface 160 may be connected to a network 162 through wireless or wired communication and thereby communicate with the external device. The wireless communication, for example, may include at least one of WiFi, Bluetooth (BT), near field communication (NFC), a GPS, and cellular communication (e.g., Long Term Evolution (LTE), Long Term Evolution-Advanced (LTE-A), Code Division Multiple Access (CDMA), Wideband Code Division Multiple Access (WCDMA), Universal Mobile Telecommunications System (UMTS), Wireless Broadband (WiBro), or Global System for Mobile Communications (GSM)). The wired communication, for example, may include at least one of a universal serial bus (USB), a high definition multimedia interface (HDMI), recommended standard 232 (RS-232), and a plain old telephone service (POTS).

According to an embodiment, the network 162 may be a telecommunications network. The telecommunications network may include at least one of a computer network, the Internet, the Internet of things, and a telephone network. According to an embodiment, a protocol (e.g., a transport layer protocol, a data link layer protocol, or a physical layer protocol) for communication between the electronic device 101 and an external device may be supported by at least one of the applications 134, the API 133, the middleware 132, the kernel 131, and the communication interface 160.

The application control module 170 may process at least some pieces of information acquired from other components (e.g., the processor 120, the memory 130, the input/output interface 140, and the communication interface 160) and provide the processed information to a user in various ways. For example, the application control module 170 may recognize information on connection components provided in the electronic device 101, store the information on connection components in the memory 130, and execute the applications 130, based on the stored information on connection components.

Figure 2:
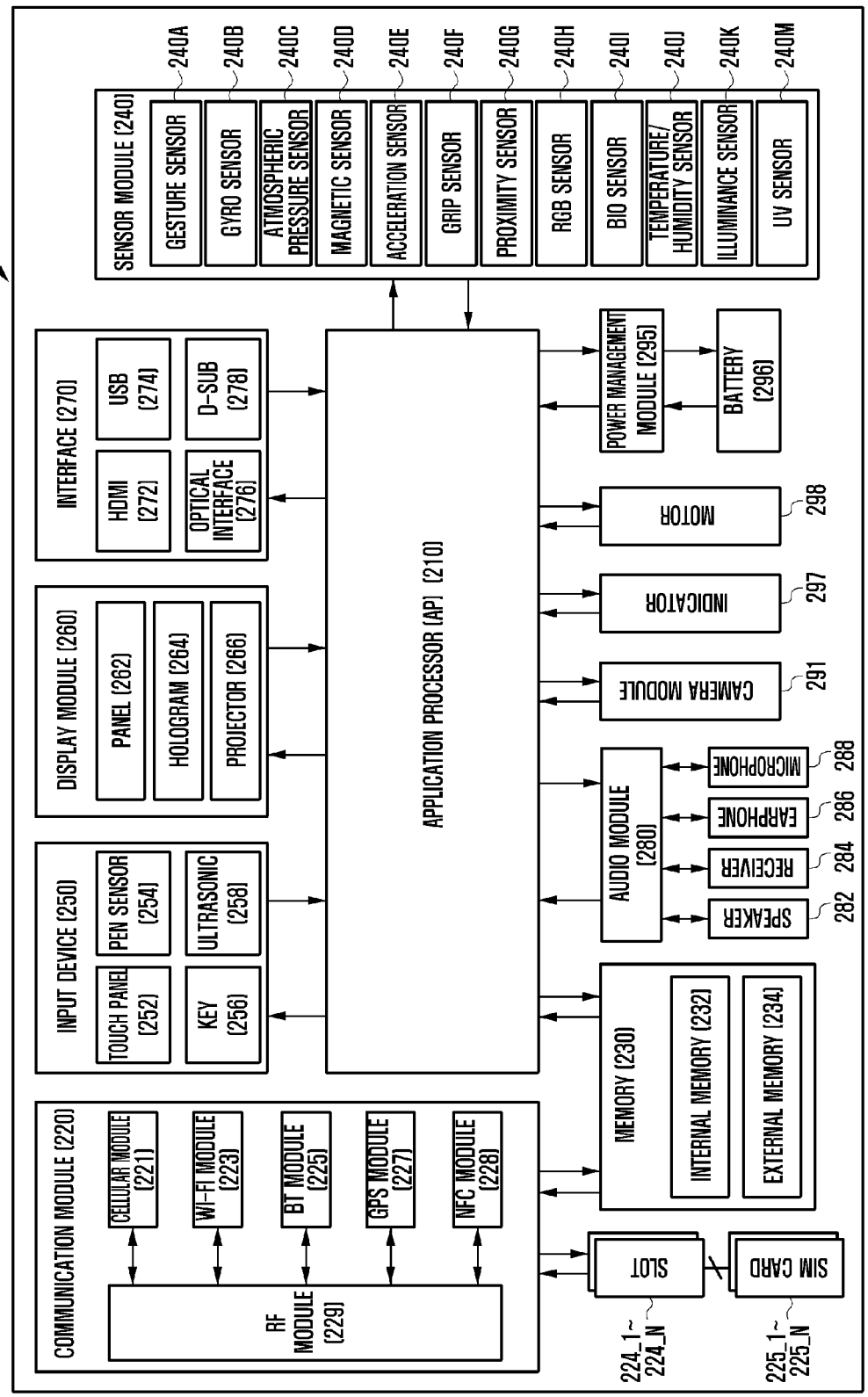
FIG. 2 is a block diagram of an electronic device in accordance with various embodiments of the present disclosure.

FIG. 2 is a block diagram of an electronic device in accordance with various embodiments of the present disclosure. It is noted that the electronic device illustrated in FIG. 2 may constitute all or a part of the electronic device 101 shown in FIG. 1.

Referring to FIG. 2, the electronic device 200 may include at least one application processor (AP) 210, a communication module 220, at least one subscriber identity module (SIM) card slots 224_1~224_N, a memory 230, a sensor module 240, an input module 250, a display 260, an interface 270, an audio module 280, a camera module 291, a power management module 295, a battery 296, an indicator 297, and a motor 298.

The AP 210 may drive an operating system or an application program to control a plurality of hardware or software components connected to the AP 210, and may perform processing and operations of various data including multimedia data. The AP 210, for example, may be implemented as a system on chip (SoC). According to an embodiment, the AP 210 may further include a graphic processing unit (GPU) (not shown).

The communication module 220 (e.g., the communication interface 160) may perform data transmission/reception in communication with other electronic devices (e.g., the electronic device 104 and the server 106) connected to the electronic device 200 (e.g., the electronic device 101) through a network (e.g., the network 162). According to an embodiment, the communication module 220 may include a cellular module 221, a WiFi module 223, a BT module 225, a GPS module 227, an NFC module 228, and a radio frequency (RF) module 229.

The cellular module 221 may provide a voice call, a video call, an SMS service, an Internet service, and the like through a communication network (e.g., LTE, LTE-A, CDMA, WCDMA, UMTS, WiBro, or GSM). Also, the cellular module 221 may identify and authenticate an electronic device in a communication network by using, for example, a SIM (e.g., the SIM card). According to an embodiment, the cellular module 221 may perform at least some of the functions that may be provided by the AP 210. For example, the cellular module 221 may perform at least a multimedia control function.

According to an embodiment, the cellular module 221 may include a communication processor (CP). Further, the cellular module 221, for example, may be implemented as a SoC. Although the cellular module 221 (e.g., a CP), the memory 230, the power management module 295, and the like are shown as separate elements from the AP 210 in FIG. 2, the AP 210 may be implemented to include at least some (e.g., the cellular module 221) or all of the aforementioned elements according to an embodiment.

According to an embodiment, the AP 210 or the cellular module 221 (e.g., a CP) may load a command or data received from at least one of a non-volatile memory and other elements connected thereto into a volatile memory and process the loaded command or data. Further, the AP 210 or the cellular module 221 may store data received from or generated by at least one of other elements in a non-volatile memory.

Each of the WiFi module 223, the BT module 225, the GPS module 227, and the NFC module 228, for example, may include a processor for processing data transmitted or received through the corresponding module. Although the cellular module 221, the WiFi module 223, the BT module 225, the GPS module 227, and the NFC module 228 are shown as separate blocks in FIG. 2, at least some (e.g., two or more) of the cellular module 221, the WiFi module 223, the BT module 225, the GPS module 227, and the NFC module 228 may be included in one integrated chip (IC) or one IC package according to an embodiment. For example, at least some processors corresponding to the cellular module 221, the WiFi module 223, the BT module 225, the GPS module 227, and the NFC module 228 respectively (e.g., a CP corresponding to the cellular module 221 and a WiFi processor corresponding to the WiFi module 223) may be implemented as one SoC.

The RF module 229 may perform data transmission/reception, for example, RF signal transmission/reception. Although not shown in the drawing, the RF module 229, for example, may include a transceiver, a power amplifier module (PAM), a frequency filter, a low noise amplifier (LNA), and the like. Also, the RF module 229 may further include a component for transmitting/receiving an electromagnetic wave over the air in wireless communication, such as a conductor or a conducting wire. Although FIG. 2 shows that the cellular module 221, the WiFi module 223, the BT module 225, the GPS module 227, and the NFC module 228 share one RF module 229, at least one of the cellular module 221, the WiFi module 223, the BT module 225, the GPS module 227, and the NFC module 228 may perform RF signal transmission/reception through a separate RF module according to an embodiment.

The at least one SIM card 225_1 to 225_N may be a card including a SIM, and may be inserted into at least one slot 224_1 to 224_N formed in a certain position of the electronic device. The at least one SIM card 225_1 to 225_N may include unique identification information (e.g., integrated circuit card identifier (ICCID)) or subscriber information (e.g., international mobile subscriber identity (IMSI)).

The memory 230 (e.g., the memory 130) may include an internal memory 232 or an external memory 234. The internal memory 232, for example, may include at least one of a volatile memory (e.g., a dynamic random access memory (DRAM), a static RAM (SRAM), or a synchronous dynamic RAM (SDRAM)) and a non-volatile memory (e.g., a one-time programmable read-only memory (OTPROM), a programmable ROM (PROM), an erasable and programmable ROM (EPROM), an electrically erasable and programmable ROM (EEPROM), a mask ROM, a flash ROM, a NAND flash memory, or an NOR flash memory).

According to an embodiment, the internal memory 232 may be a solid state drive (SSD). The external memory 234 may further include a flash drive, for example, a compact flash (CF), a secure digital (SD), a micro secure digital (Micro-SD), a mini secure digital (Mini-SD), an extreme digital (xD), or a memory stick. The external memory 234 may be functionally connected to the electronic device 200 through various interfaces. According to an embodiment, the electronic device 200 may further include a storage device (or storage medium) such as a hard drive.

The sensor module 240 may measure a physical quantity or detect an operation state of the electronic device 200 and convert the measured or detected information into an electronic signal. The sensor module 240, for example, may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., a red, green and blue (RGB) sensor), a biometric sensor 240I, a temperature/humidity sensor 240J, a light sensor 240K (e.g., an illuminance sensor), and a ultraviolet (UV) sensor 240M. Additionally or alternatively, the sensor module 240, for example, may include an E-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris scanner (not shown), and/or a fingerprint sensor (not shown). The sensor module 240 may further include a control circuit for controlling one or more sensors included therein.

The input module 250 may include a touch panel 252, a (digital) pen sensor 254, a key 256, or an ultrasonic input unit 258. The touch panel 252 that recognizes a touch input, for example, may include at least one of a capacitive touch panel, a resistive touch panel, an infrared touch panel, and an acoustic wave touch panel. Also, the touch panel 252 may further include a control circuit. When the touch panel is a capacitive touch panel, it may recognize a physical contact or proximity. The touch panel 252 may also further include a tactile layer. In this case, the touch panel 252 may provide a tactile response to a user.

The (digital) pen sensor 254, for example, may be implemented using a means identical or similar to a means for receiving a touch input from a user or using a separate recognition sheet. The key 256, for example, may include a physical button, an optical key, or a keypad. The ultrasonic input unit 258 is a unit that can identify data by generating an ultrasonic signal through an input tool and detecting a sonic wave through a microphone (e.g., a microphone 288) in the electronic device 200, and is capable of wireless recognition. According to an embodiment, the electronic device 200 may also receive a user input from an external device (e.g., computer or server) connected thereto by using the communication module 220.

The display 260 (e.g., the display 150) may include a panel 262, a hologram unit 264, or a projector 266. The panel 262, for example, may be a liquid crystal display (LCD) or an active matrix-organic light emitting diode (AM-OLED). The panel 262, for example, may be implemented to be flexible, transparent, or wearable. The panel 262 may also be incorporated into one module together with the touch panel 252. The hologram unit 264 may show a stereoscopic image in the air by using light interference. The projector 266 may display an image by projecting light onto a screen. The screen, for example, may be located inside or outside of the electronic device 200. According to an embodiment, the display 260 may further include a control circuit for controlling the panel 262, the hologram unit 264, and/or the projector 266.

The interface 270, for example, may include an HDMI 272, a USB 274, an optical interface 276, or a D-subminiature (D-sub) 278. The interface 270, for example, may be included in the communication interface 160 shown in FIG. 1. Additionally or alternatively, the interface 270, for example, may include a mobile high-definition link (MHL) interface, a SD card/multimedia card (MMC) interface, or an infrared data association (IrDA) interface.

The audio module 280 may provide bidirectional conversion between a sound and an electronic signal. At least some elements of the audio module 280, for example, may be included in the input/output interface 140 shown in FIG. 1. The audio module 280, for example, may process sound information input or output through a speaker 282, a receiver 284, earphones 286, or the microphone 288.

The camera module 291 is a device that can take both still and moving images, and according to an embodiment, may include one or more image sensors (e.g., a front sensor or a rear sensor, not shown), a lens (not shown), an image signal processor (ISP) (not shown), or a flash (e.g., an LED or xenon lamp, not shown).

The power management module 295 may manage power of the electronic device 200. Although not shown, the power management module 295, for example, may include a power management integrated circuit (PMIC), a charger IC, or a battery or fuel gauge.

The PMIC, for example, may be mounted in an IC or an SoC semiconductor. Charging methods may be classified into wired charging and wireless charging. The charger IC may charge a battery, and may prevent an overvoltage or excess current from being induced or flowing from a charger. According to an embodiment, the charger IC may include a charger IC for at least one of the wired charging and the wireless charging. Examples of the wireless charging include magnetic resonance charging, magnetic induction charging, and electromagnetic charging, and an additional circuit such as a coil loop, a resonance circuit, and a rectifier may be added for the wireless charging.

The battery gauge, for example, may measure the residual capacity, charge in voltage, current, or temperature of the battery 296. The battery 296 may store or generate electricity, and may supply power to the electronic device 200 by using the stored or generated electricity. The battery 296, for example, may include a rechargeable battery or a solar battery.

The indicator 297 may display a specific status of the electronic device 200 or a part thereof (e.g., the AP 210), for example, a boot-up status, a message status, or a charging status. The motor 298 may convert an electrical signal into a mechanical vibration. Although not shown, the electronic device 200 may include a processing unit (e.g., GPU) for supporting a mobile TV. The processing unit for supporting a mobile TV may process media data pursuant to a certain standard, for example, digital multimedia broadcasting (DMB), digital video broadcasting (DVB), or media flow.

Each of the above described elements of the electronic device according to the present disclosure may be formed by one or more components, and the names of the corresponding elements may vary according to the type of the electronic device. The electronic device according to embodiments of the present disclosure may include at least one of the above described elements, and may exclude some of the elements or further include other additional elements. Further, some of the elements of the electronic device according to embodiments of the present disclosure may be coupled to form a single entity while performing the same functions as those of the corresponding elements before the coupling.

The term "module" as used in the present disclosure, for example, may mean a unit including one of hardware, software, and firmware or any combination of two or more of them. The "module", for example, may be interchangeable with the term "unit", "logic", "logical block", "component", or "circuit". The "module" may be the smallest unit of an integrated component or a part thereof. The "module" may be the smallest unit that performs one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing certain operations, which are now known or will be developed in the future.

Figure 3:
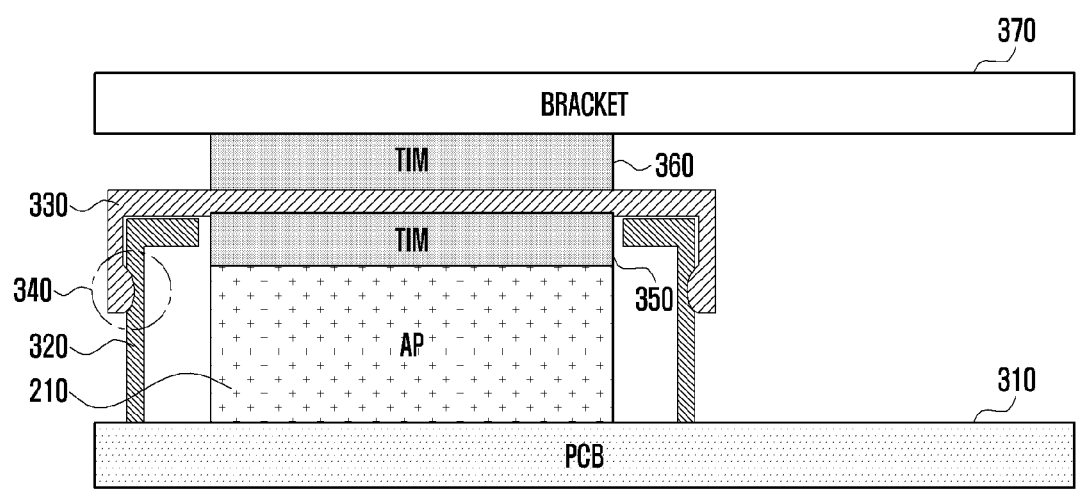
FIG. 3 is a side view of an electronic device having a shield can in accordance with various embodiments of the present disclosure.

FIG. 3 is a side view of an electronic device having a shield can in accordance with various embodiments of the present disclosure.

Referring to FIG. 3, the shield can 320 and 330 is a device used to perform electromagnetic shielding for various internal devices (e.g., the AP 210 shown in FIG. 2) mounted on a substrate 310 (e.g., a printed circuit board (PCB)). As shown, the shield can 320 and 330 may have a structure of being fixed to the substrate 310 so as to cover the internal device 210 on the substrate 310 and, in an embodiment, may have a combined structure of a shield frame 320 and a shield cover 330.

According to an embodiment, when the internal device 210 is mounted on the substrate 310 by soldering in a surface mount device (SMD) process, the shield frame 320 may also be mounted on the substrate 310 by soldering. Therefore, the shield can 320 and 330 requires heat resistance to a high temperature as well as conductivity for electromagnetic shielding. By soldering the shield frame 320, the entire shield can 320 and 330 may be fixed to the substrate 310. In this embodiment, the shield cover 330 may be separated from the shield frame 320 as further described below. Therefore, even after the SMD process is finished, if the internal device 210 which has a defect, it may be replaced by detaching the shield cover 330 from the shield frame 320.

In an embodiment, the shield cover 330 may be located over the internal device 210. For example, the shield cover 330 may have a main horizontal portion and a lateral vertical portion. The lateral vertical portion is downwardly extended from an edge of the main horizontal portion and may have, in part, a bump which protrudes inwardly from the lateral vertical portion, for example, at an end of the lateral vertical portion. In an embodiment, there may be two or more bumps. As shown, the main horizontal portion of the shield cover 330 may cover the top of the internal device 210, and the lateral vertical portion may partially cover the shield frame 320.

In an embodiment, the shield frame 320 may be formed vertically on the substrate 310 to surround the internal device 210. For example, the shield frame 320 may have a main vertical portion mounted vertically on the substrate 310 and a supporting end portion which is inwardly extended from the end of the main vertical portion. The main vertical portion may have a connecting part for receiving therein the bump of the shield cover 330. The supporting end portion may support the shield cover 330 when the shield cover 330 is fastened to the shield frame 320.

In various embodiments, the shield frame 320 and the shield cover 330 may have a fastening part 340. The bump of the shield cover 330 and the connecting part of the shield frame 320 are examples of the fastening part 340. In an embodiment, the connecting part of the shield frame 320 may be formed of at least one hole for receiving therein the bump. Alternatively, the connecting part of the shield frame 320 may include an indent, depression or other means for receiving and coupling with the bump of the shield cover 330. Various examples of the fastening part 340 will be described below.

In an embodiment, a thermal interface material (TIM) 350 may be attached to a lower surface (facing the internal device 210) of the main horizontal portion of the shield cover 330. The TIM 350 may reduce contact thermal resistance. That is, when different materials (e.g., the internal device 210 and the shield cover 330, or the shield cover 330 and a bracket 370) are in contact with each other, the contact may increase a thermal resistance, which in turn may impede a smooth heat transfer. Therefore, heat generated from the internal device 210 may not dissipate properly to the outside. The TIM 350 is capable of minimizing contact thermal resistance and may promote heat dissipation. In an embodiment, another TIM 360 may be attached to an upper surface of the shield cover 330 and be covered with the bracket 370. Therefore, heat generated from the internal device 210 may dissipate to the outside more easily through the bracket 370.

Figure 4A:
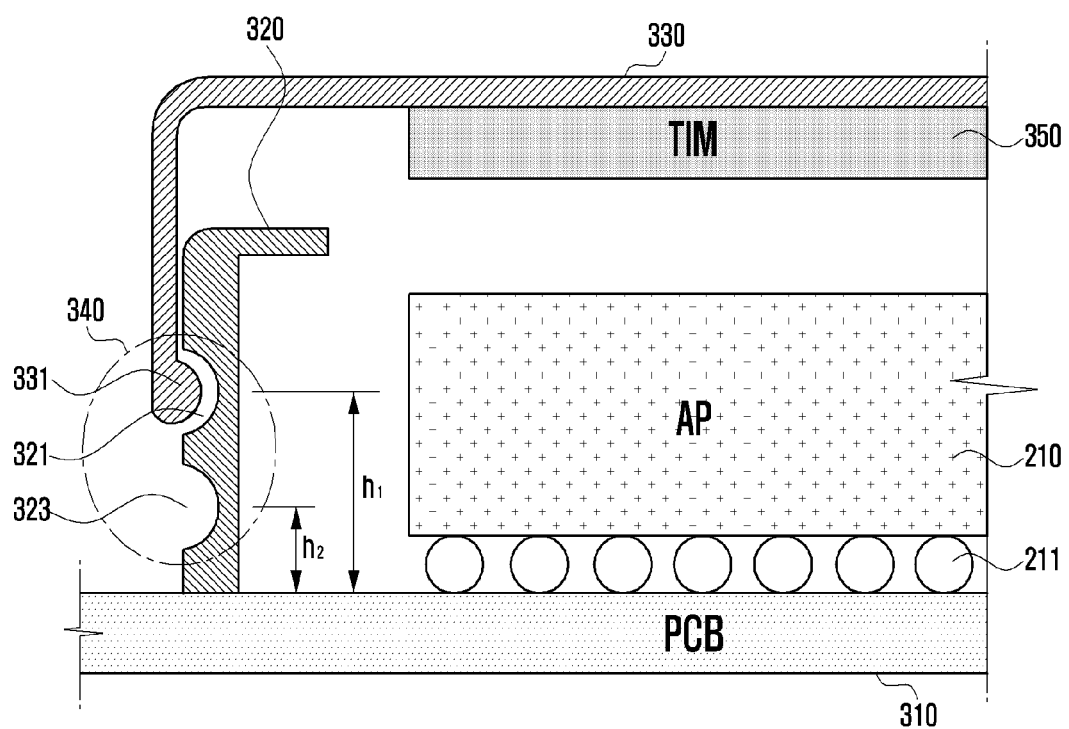
FIG. 4A is a cross-sectional view illustrating an example of a fastening relation between a shield frame and a shield cover before a surface mount device (SMD) process in accordance with an embodiment of the present disclosure.

FIG. 4A is a cross-sectional view illustrating an example of a fastening relation between a shield frame and a shield cover before a surface mount device (SMD) process in accordance with an embodiment of the present disclosure.

Referring to FIG. 4A, the fastening part 340 may include a bump 331 of the shield cover 330 and a first connecting part 321 and a second connecting part 323 of the shield frame 320. The first and second connecting parts 321 and 323 of the shield frame 320 may selectively fix the bump 331 of the shield cover 330 at a first height h1 or a second height h2 from the substrate 310, respectively. In an embodiment, the first connecting part 321 may be formed as a hole at the first height h1 and the second connecting part 323 may be formed as a hole at the second height h2. The first and second connecting parts 321 and 323 may be disposed on the same line in a vertical direction. Again, the first and second connecting parts 321 and 323 may alternatively or additionally include an indent, depression or other means for receiving and coupling with the bump 331 of the shield cover 330.

Before the shield cover 330 is fastened to the shield frame 320, the TIM 350 may be attached to the lower surface of the shield cover 330. The shield cover having the TIM 350 may be temporarily fixed to the shield frame 320 by inserting the bump 331 into the first connecting part 321. While the shield cover 330 is fastened to the shield frame 320, the SMD process may be performed by soldering the internal device 210 and the shield frame 320 on the substrate 310. The internal device 210 may be soldered through solder balls 211, for example. When the shield cover 330 is fastened to the first connecting part 321 of the shield frame 320, a certain space may exist between the internal device 210 and the TIM 350.

Figure 4B:
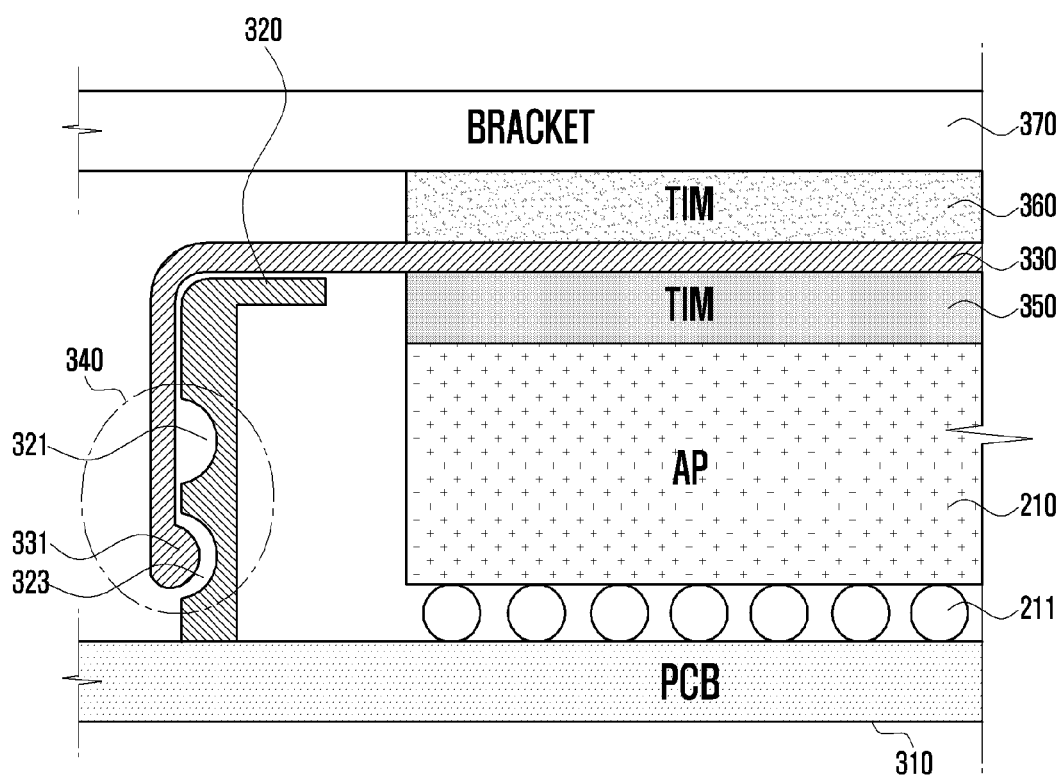
FIG. 4B is a cross-sectional view illustrating an example of a fastening relation between a shield frame and a shield cover when a press is performed after an SMD process in accordance with an embodiment of the present disclosure.

FIG. 4B is a cross-sectional view illustrating an example of a fastening relation between a shield frame and a shield cover when a press is performed after an SMD process in accordance with an embodiment of the present disclosure.

Referring to FIG. 4B, a pressure may be applied to the shield cover 330 toward the substrate 310, so that the shield cover 330 may move toward the substrate 310. For example, when a pressure higher than a critical point is applied, the shield cover 330 is lowered and the bump 331 moves to the second connecting part 323 from the first connecting part 321. Therefore, the TIM 350 attached to the lower surface of the shield cover 330 may be in contact with the top surface of the internal device 210.

The TIM 350 may be susceptible to heat and pressure. In this embodiment, since there is a space between the TIM 350 and the internal device 210, in the SMD process, which is performed under high temperature and high pressure environments, any detrimental influence on the TIM 350 may be minimized in the SMD process. Additionally, since the SMD process is performed after the shield cover 330 is fastened to the shield frame 320, the number of processes required may be reduced in comparison with a case where the shield cover 330 is fastened after the shield frame 320 only is soldered. According to an embodiment, by simply pressing the shield cover 330 after the SMD process, a final structure of the shield can is obtained. This shield can structure may not only offer reliable electromagnetic shielding, but also allow effective heat dissipation through the TIM 350 on the internal device 210.

Figure 5:
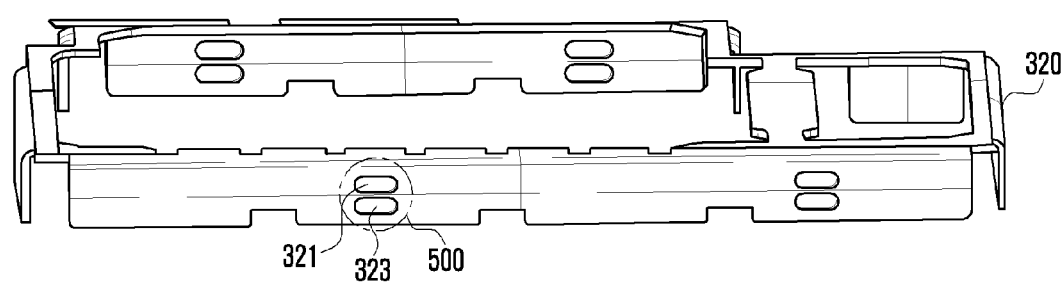
FIG. 5 is a perspective view illustrating a structure of a shield frame in accordance with various embodiments of the present disclosure.

FIG. 5 is a perspective view illustrating a structure of a shield frame in accordance with various embodiments of the present disclosure.

Referring to FIG. 5, the shield frame 320 may have a lateral vertical portion. For example, if the internal device has a rectangular form, the shield frame 320 may have four lateral vertical portions to surround four lateral sides of the internal device. As shown, at least one of such lateral vertical portions of the shield frame 320 may have a connecting part 500 for selectively fixing the bump 331 of the shield cover 330 at the first or second height. The connecting part 500 may be formed of two or more connecting parts corresponding to the number of bumps 331. As discussed above, the connecting part 500 may have the first connecting part 321 for fixing the bump 331 at the first height and the second connecting part 323 for fixing the bump 331 at the second height.

Figure 6A:
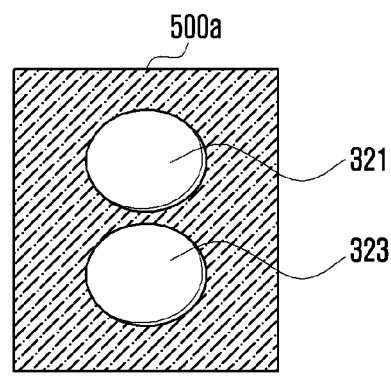
FIGS. 6A, 6B, and 6C show a connecting part of a shield frame in accordance with various embodiments of the present disclosure.
Figure 6B:
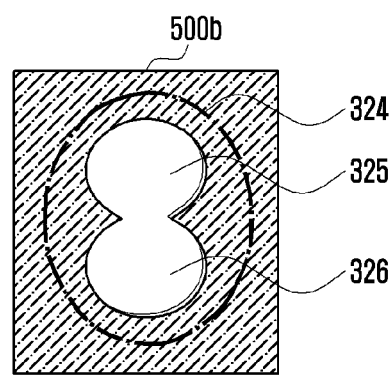
Figure 6C:
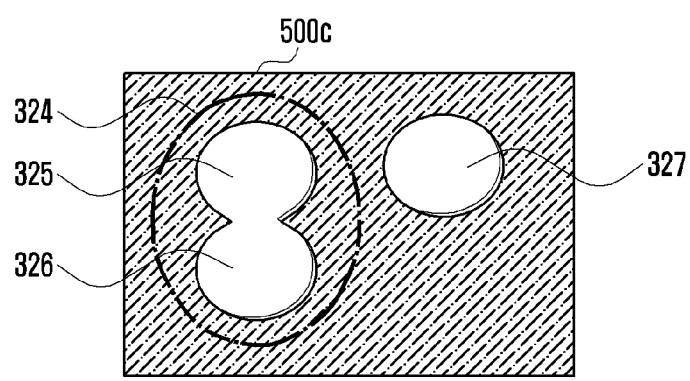

FIGS. 6A to 6C show a connecting part of a shield frame in accordance with various embodiments of the present disclosure.

Referring to FIG. 6A, a connecting part 500*a* may have the first and second connecting parts 321 and 323 respectively formed at the first and second heights. For example, the bump 331 of the shield cover 330 is temporarily fixed to the first connecting part 321. After the SMD process, the bump 331 may be fixed to the second connecting part 323 by applying a pressure to the shield cover 330.

Referring to FIG. 6B, a connecting part 500*b* may have a single opening 324 for receiving the bump 331 of the shield cover 330. This single opening 324 has an overlapped form of two hole parts 325 and 326. The first and second hole parts 325 and 326 are designed to fix the bump 331 at the first and second heights, respectively. For example, the bump 331 of the shield cover 330 may be temporarily fixed to the first hole part 325. After the SMD process, the bump 331 may be fixed to the second hole part 326 by applying a pressure to the shield cover 330. In this embodiment, the single opening 324 having an overlapped form of two hole parts 325 and 326 may reduce the height of the shield frame 320.

Referring to FIG. 6C, a connecting part 500*c* may have at least two openings 324 and 327 for receiving at least two bumps 331 formed at different heights along the lateral vertical portion of the shield cover 330. At least one of such openings (e.g., opening 324) may have the first and second hole parts 325 and 326 which are designed to fix the bump 331 at the first and second heights, respectively. This bump 331 may be formed at a lower position on the lateral vertical portion of the shield cover 330 in comparison with another bump inserted into another opening (e.g., 327). For example, the bump 331 of the shield cover 330 corresponding to the opening 324 may be fixed to the first hole part 325 and, after the SMD process, fixed to the second hole part 326 by applying a pressure to the shield cover 330. When a pressure is applied to the shield cover 330, the other opening 327 may receive another bump 331 formed at a relatively greater height along the lateral vertical portion of the shield cover 330. According to this embodiment, it may be possible to effectively reduce the height of the shield frame 320 and also to fasten the shield cover 330 and the shield frame 320 more stably.

Figure 7A:
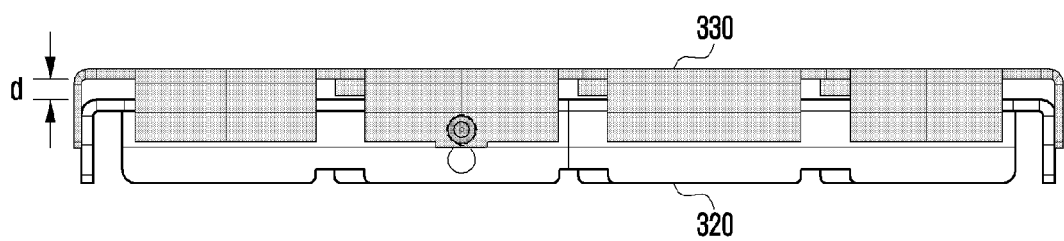
FIG. 7A is a side view illustrating a structure of a shield can before an SMD process in accordance with an embodiment of the present disclosure.

FIG. 7A is a side view illustrating a structure of a shield can before an SMD process in accordance with an embodiment of the present disclosure.

Referring to FIG. 7A, before the SMD process is performed, the bump of the shield cover 330 having the TIM attached to the inside surface thereof may be fixed to the shield frame 320 at the first height. Therefore, the TIM attached to the shield cover 330 and the internal device located in the shield frame 320 may be separated from each other by a certain distance d.

Figure 7B:
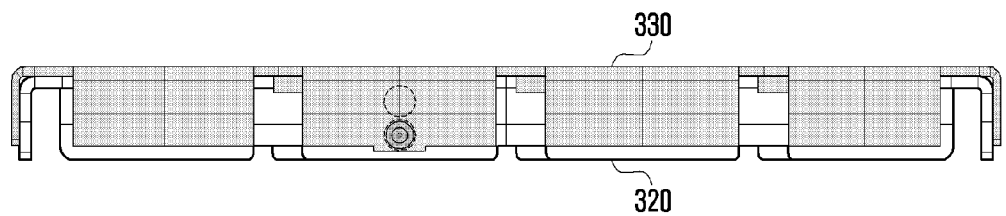
FIG. 7B is a side view illustrating a structure of a shield can when a press is performed after an SMD process in accordance with an embodiment of the present disclosure.

FIG. 7B is a side view illustrating a structure of a shield can when a press is performed after an SMD process in accordance with an embodiment of the present disclosure.

Referring to FIG. 7B, a pressure may be applied to the shield cover 330 after the SMD process is performed. In that case, the bump of the shield cover 330 may be fixed to the shield frame 320 at the second height. Therefore, the TIM attached to the inside surface of the shield cover 330 may be attached to the top surface of the internal device located in the shield frame 320.

Figure 8A:
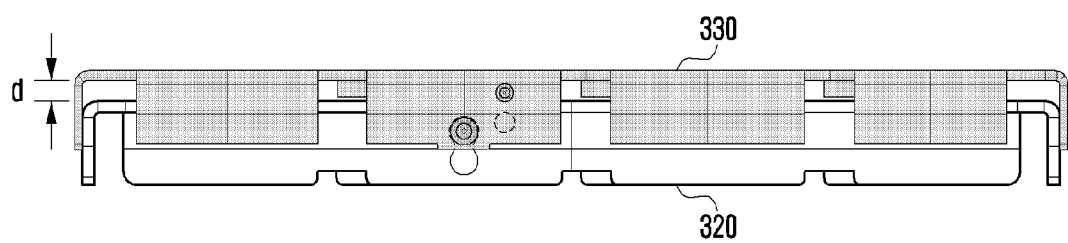
FIG. 8A is a side view illustrating a structure of a shield can before an SMD process in accordance with another embodiment of the present disclosure.

FIG. 8A is a side view illustrating a structure of a shield can before an SMD process in accordance with another embodiment of the present disclosure.

Referring to FIG. 8A, the shield cover 330 may have the TIM attached to the inside surface thereof and also have at least two bumps formed at different heights along the lateral vertical portion thereof. The size of two bumps may be equal or different. In an embodiment, the shield frame 320 may have at least two openings corresponding to the bumps. One opening may have the first and second hole parts for fixing one bump at the first and second heights, respectively. The other opening may fix another bump at the second height. Before the SMD process is performed, the bump formed at a lower position on the lateral vertical portion of the shield cover 330 may be received in the first hole part of a corresponding opening of the shield frame 320. Therefore, the shield cover 330 may be fixed at the first height such that the TIM attached to the shield cover 330 and the internal device located in the shield frame 320 may be separated from each other by a certain distance d.

Figure 8B:
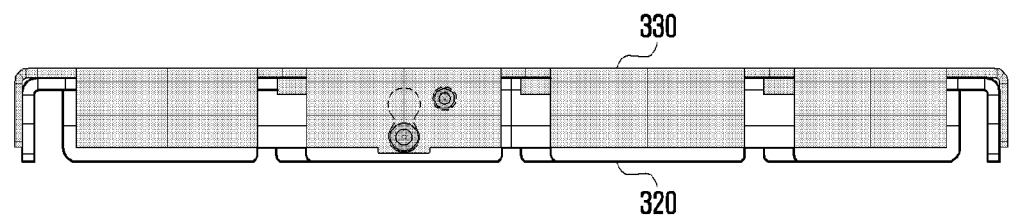
FIG. 8B is a side view illustrating a structure of a shield can when a press is performed after an SMD process in accordance with another embodiment of the present disclosure.

FIG. 8B is a side view illustrating a structure of a shield can when a press is performed after an SMD process in accordance with another embodiment of the present disclosure.

Referring to FIG. 8B, a pressure may be applied to the shield cover 330 after the SMD process is performed. In that case, one bump of the shield cover 330 received in the first hole part of the shield frame 320 may be moved and fixed to the second hole part of the shield frame 320. Also, the other bump may be fixed to the corresponding opening. Therefore, the shield cover 330 may be fixed at the second height such that the TIM attached to the inside surface of the shield cover 330 may be attached to the top surface of the internal device located in the shield frame 320.

As discussed hereinbefore, the shield can, according to various embodiments of this disclosure, may offer a reliable electromagnetic shielding function as well as effective heat dissipation.

Additionally, the electronic device according to various embodiments of this disclosure may have improved electromagnetic shielding and heat dissipation.

A method for manufacturing the electronic device according to various embodiments of this disclosure may offer a shielding structure for reducing an error rate in the SMD process.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A shield can for electromagnetic shielding, the shield can comprising:
    a shield cover having a bump protruding at a height of the shield cover laterally therefrom; and
    a shield frame having a connecting part for selectively fixing the same bump at a first height or a second height of the shield frame such that the shield frame is fastened to the shield cover,
    wherein the connecting part includes:
        a first hole for fixing the same bump at the first height of the shield frame and,
        a second hole for fixing the same bump at the second height of the shield frame, the first hole and the second hole are aligned vertically.

2. The shield can of claim 1,
    wherein the first hole and the second hole include an opening for receiving the same bump.

3. The shield can of claim 1, wherein the shield cover has another bump.

4. The shield can of claim 3, wherein the connecting part further includes:
    a third hole, and
    a fourth hole for selectively fixing the other bump at a third height of the shield frame or a fourth height of the shield frame.

5. An electronic device comprising:
    a substrate;
    an internal device mounted on the substrate; and
    a shield can that comprises:
        a shield cover located over the internal device and having a bump protruding at a height of the shield cover laterally therefrom, and
        a shield frame formed vertically on the substrate to surround the internal device and having a connecting part for selectively fixing the bump at a first height or a second height of the shield frame to be fastened to the shield cover, wherein the connecting part includes:
            a first hole for fixing the same bump at the first height of the shield frame, and
            a second hole for fixing the same bump at the second height of the shield frame, the first hole and the second hole are aligned vertically.

6. The electronic device of claim 5, further comprising a thermal interface material (TIM) attached to a lower surface of the shield cover, the lower surface facing a top surface of the internal device.

7. The electronic device of claim 6,
    wherein the first height from the substrate is greater than the second height from the substrate, and
    wherein the TIM is in contact with the top surface of the internal device when the same bump of the shield cover is fixed at the second hole.

8. The electronic device of claim 5,
    wherein the first hole and the second hole have an opening for receiving the same bump.

9. The electronic device of claim 5, wherein the shield cover has another bump.

10. The electronic device of claim 9, wherein the connecting part further includes:
    a third hole, and
    a fourth hole for selectively fixing the other bump at a third height of the shield frame or a fourth height of the shield frame.

11. A shield can for electromagnetic shielding, the shield can comprising:
    a shield cover having a first protrusion at a height of the shield cover extending laterally therefrom; and
    a shield frame having a connecting part for coupling with the first protrusion at a first height or a second height of the shield frame such that the shield frame is coupled with the shield cover,
    wherein the connecting part includes:
        a first hole for fixing the first protrusion at the first height of the shield frame, and
        a second hole for fixing the first protrusion at the second height of the shield frame, the first hole and the second hole are aligned vertically.

12. The shield can of claim 11,
    wherein the first hole and the second hole have an opening for receiving the first protrusion.

13. The shield can of claim 11, wherein the shield cover has a second protrusion.

14. The shield can of claim 13, wherein the connecting part further includes:
    a third hole, and
    a fourth hole for selectively fixing the second protrusion at a third height of the shield frame or a fourth height of the shield frame.

\* \* \* \* \*